(12) United States Patent
Macall

(10) Patent No.: US 9,818,670 B2
(45) Date of Patent: Nov. 14, 2017

(54) COOLING DEVICE INSTALLATION USING A RETAINER ASSEMBLY

(75) Inventor: Thomas George Macall, San Jose, CA (US)

(73) Assignee: Infinera Corporation, Sunnyvale, CA (US)

( * ) Notice: Subject to any disclaimer, the term of this patent is extended or adjusted under 35 U.S.C. 154(b) by 0 days.

(21) Appl. No.: 13/194,044

(22) Filed: Jul. 29, 2011

(65) Prior Publication Data

US 2013/0027889 A1 Jan. 31, 2013

(51) Int. Cl.
*H05K 7/20* (2006.01)
*H01L 23/40* (2006.01)
*H01L 23/467* (2006.01)
*H01L 23/367* (2006.01)

(52) U.S. Cl.
CPC ........ *H01L 23/4006* (2013.01); *H01L 23/467* (2013.01); *H05K 7/20154* (2013.01); *H01L 23/3672* (2013.01); *H01L 23/4012* (2013.01); *H01L 2023/4081* (2013.01); *H01L 2023/4087* (2013.01); *H01L 2924/0002* (2013.01); *H05K 7/20418* (2013.01)

(58) Field of Classification Search
CPC ........ H01L 23/4012; H01L 2023/4081; H01L 2023/4087; H01L 23/3672; H01L 23/4006; H01L 23/467; H05K 7/20418; H05K 9/0016; H05K 7/20154
USPC ....... 361/710, 720, 702, 715, 716, 721, 810; 257/718, 719, 727
See application file for complete search history.

(56) References Cited

U.S. PATENT DOCUMENTS

| | | | | |
|---|---|---|---|---|
| 5,426,565 A | * | 6/1995 | Anderson | H01L 23/4006 257/719 |
| 5,991,152 A | * | 11/1999 | Chiou | H01L 23/4093 24/458 |
| 6,014,315 A | * | 1/2000 | McCullough et al. | 361/704 |
| 6,130,821 A | * | 10/2000 | Gerber | 361/704 |
| 6,332,946 B1 | * | 12/2001 | Emmett et al. | 156/299 |
| 6,816,376 B2 | * | 11/2004 | Bright et al. | 361/704 |
| 6,947,284 B2 | * | 9/2005 | Liu | 361/704 |
| 6,980,437 B2 | * | 12/2005 | Bright | 361/704 |
| 7,120,027 B2 | * | 10/2006 | Yatskov et al. | 361/716 |

(Continued)

FOREIGN PATENT DOCUMENTS

WO  WO 2009100910 A1 * 8/2009

*Primary Examiner* — Anatoly Vortman
*Assistant Examiner* — Jacob Crum
(74) *Attorney, Agent, or Firm* — Harrity & Harrity, LLP; David L. Soltz

(57) ABSTRACT

A system includes a retainer assembly to align each of a group of cooling devices with a corresponding electrical component of a group of electrical components that are mounted to a circuit board, where the retainer assembly includes a group of apertures, such that each of the cooling devices protrudes through a corresponding aperture when the retainer assembly is installed on the circuit board, and where the retainer assembly includes a group of retaining springs, each of which is associated with a corresponding aperture, that applies a respective force, of a group of forces, to a corresponding one of the cooling devices when the retainer assembly is installed on the circuit board. The system also includes a set of fasteners to mount the retainer assembly to the circuit board, such that the cooling devices dissipate heat that is generated by the electrical components.

9 Claims, 7 Drawing Sheets

(56) References Cited

U.S. PATENT DOCUMENTS

| | | | |
|---|---|---|---|
| 7,355,857 B2* | 4/2008 | Pirillis et al. | 361/715 |
| 7,539,018 B2* | 5/2009 | Murr et al. | 361/704 |
| 7,995,344 B2* | 8/2011 | Dando et al. | 361/710 |
| 2004/0247925 A1* | 12/2004 | Cromwell | H01L 23/4006 428/548 |
| 2008/0192438 A1* | 8/2008 | Chang | H01L 23/4006 361/719 |

* cited by examiner

COOLING DEVICE INSTALLATION USING A RETAINER ASSEMBLY

BACKGROUND

Public and/or proprietary networks carry more and more traffic using network devices that process the traffic at ever increasing bandwidths, data rates, processing speeds, etc. To achieve these bandwidths, data rates, processing speeds, etc., network devices have been equipped with more complex and/or a greater quantity of high performance components, such as higher speed processors, higher capacity switches, faster memories, and/or other components that have improved the performance of the network devices over earlier versions of the network devices.

The components that are capable of higher performance often generate more heat than the components that they replace. Additionally, the greater quantity of components can cause circuit board component density to increase, which generates more heat within a particular volume within the network devices. Unfortunately, the network devices are not always capable of dissipating the heat, within the particular volume, without a modification that increases a cost associated with the network device. Additionally, the greater quantity of components often corresponds to installing a greater quantity of heat dissipation devices on the circuit board. The installation of the greater quantity of heat dissipation devices may occupy an increased amount of circuit board space, which may increase cost of the network devices. Also, cooling multiple network devices using a single heat dissipation device is not always feasible due to variations in dimensions (e.g., thicknesses) of the network devices which may not coincide with dimensions of the heat dissipation device.

SUMMARY

According to one aspect, a system may include a retainer assembly to align each of a group of cooling devices with a corresponding one of a group of electrical components that are mounted to a circuit board, where the retainer assembly may include a group of apertures, such that each of the group of cooling devices protrudes through a corresponding one of the group of apertures when the retainer assembly is installed on the circuit board, and where the retainer assembly may include a group of retaining springs, each of which being associated with a corresponding one of the group of apertures, that apply a respective one of a group of forces to a corresponding one of the group of cooling devices when the retainer assembly is installed on the circuit board. The system may also include a set of fasteners to mount the retainer assembly to the circuit board, such that each of the group of cooling devices dissipates heat that is generated by a corresponding one of the group of electrical components.

According to another aspect a device may include a group of heat sinks, each of which may include a corresponding one of a group of cooling fins; a group of electrical components; and a group of retaining wires. The device may also include a stiffening plate to align each of the group of heat sinks with a corresponding one of a group of electrical components that are mounted to a base, where the stiffening plate may include a group of apertures, through which a corresponding one of the group of cooling fins protrudes when the stiffening plate is installed on the base, and where each of the group of retaining wires is associated with a respective one of the group of apertures and applies a respective one of a group of forces to a corresponding one of the group of heat sinks when the stiffing plate is mounted to the base. The device may further include a set of fasteners to mount the stiffening plate to the base, such that the group of heat sinks dissipate heat that is generated by the group of electrical components.

According to yet another aspect, a retainer assembly may include a stiffening plate that includes a group of openings, where each of the group of openings is to receive a portion of a corresponding one of a group of cooling devices when the group of cooling devices are to be associated with a group of electrical components. The retainer assembly may also include a group of retaining mechanisms, where each of the group of retaining mechanisms may be provided in a corresponding one of the group of openings of the stiffening plate, where each of the group of retaining mechanisms may apply a respective one of a group of retaining forces on a corresponding one of the group of cooling devices, and where the respective one of the group of retaining forces places a corresponding one of the group of cooling devices in contact with an associated one of the group of electrical components. The retainer assembly may further include at least one fastener to connect the stiffening plate to a base on which the group of electrical components are mounted.

BRIEF DESCRIPTION OF THE DRAWINGS

The accompanying drawings, which are incorporated in and constitute a part of this specification, illustrate one or more implementations described herein and, together with the description, explain these implementations. In the drawings.

DETAILED DESCRIPTION

The following detailed description refers to the accompanying drawings. The same reference numbers in different drawings may identify the same or similar elements.

A system and/or method, described herein, may enable one or more components, associated with a computing and/or communication device, to be cooled using a cooling system that is installed using a cooling system retainer assembly (hereinafter referred to as a "retainer assembly"). The cooling system may include one or more cooling devices, such as heat sinks, vapor chambers, heat pipes, etc. The system and/or method may allow the retainer assembly to be used to align the cooling devices with the components. The system and/or method may allow the retainer assembly to be used to mount the cooling devices to the components by attaching the retainer assembly to a base, such as a circuit board, on which the components are installed. Using the retainer assembly to mount the cooling devices, to the components, may decrease a mounting area, relative to the circuit board, that would be used when mounting the cooling devices without using the retainer assembly. The decreased mounting area may enable additional components to be installed on the circuit board and/or may permit a component density to be increased as a result of mounting the cooling devices using the retainer assembly.

Figure 1:
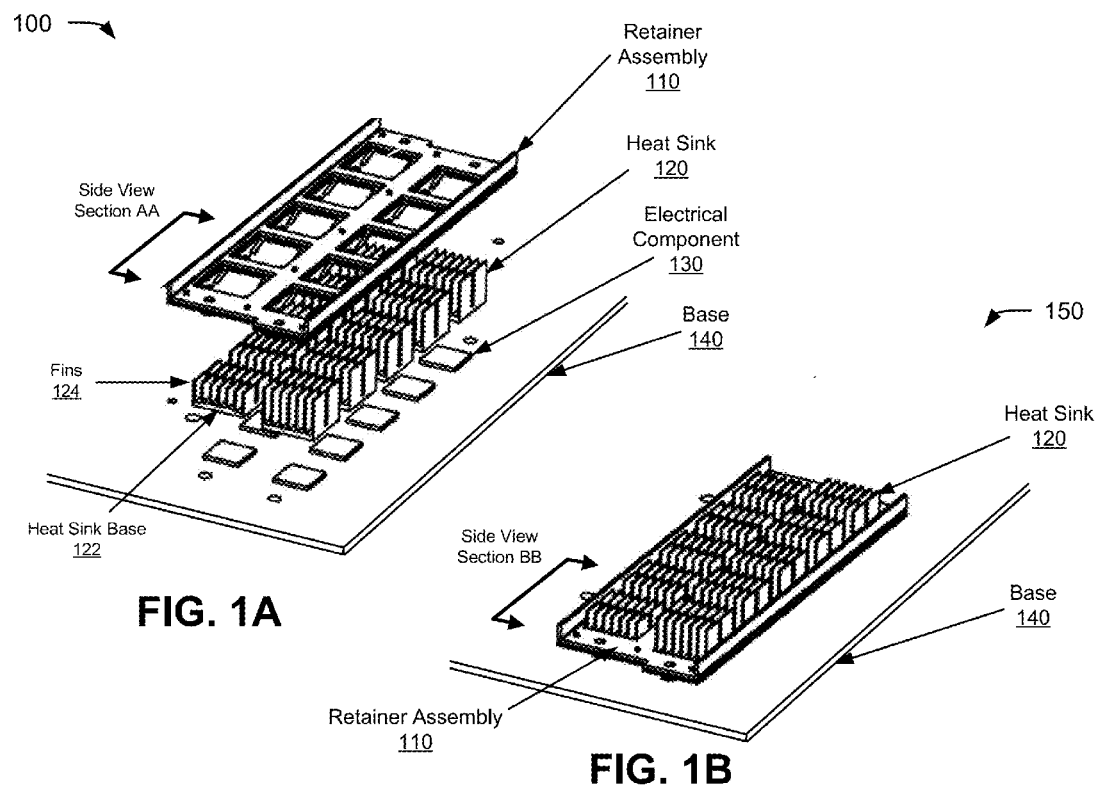
FIGS. 1A and 1B are diagrams of an overview of an installation of a cooling system using a retainer assembly, according to an implementation described herein.

FIGS. 1A and 1B are diagrams of an overview of an installation of a cooling system using a retainer assembly, according to an implementation described herein. As shown in FIG. 1A, cooling system 100 may include a retainer assembly 110, a group of heat sinks 120 (hereinafter referred to collectively as "heat sinks 120" and individually as "heat sink 120"), a group of electrical components 130 (hereinafter referred to collectively as "components 130" and individually as "component 130"), and a base 140. The quantity of devices, illustrated in FIG. 1A, is provided for explanatory purposes only. In practice, there may be additional devices; fewer devices; different devices; or differently arranged devices than illustrated in FIG. 1A.

Retainer assembly 110 may include one or more devices that enable cooling devices to be installed on components that are mounted to a circuit board. In one example, retainer assembly 110 may allow heat sinks 120 to be aligned with components 130 when retainer assembly 110 is installed on base 140. In another example, retainer assembly 110 may allow heat sinks 120 to be mounted to components 130 when retainer assembly 110 is installed on base 140. In yet another example, retainer assembly 110 may cause heat sink 120 to contact component 130 with a quantity of force and/or pressure that is greater than a threshold. The quantity of force and/or pressure may allow heat sink 120 to remain in contact with component 130 and/or to remain stationary, relative to component 130, when a network component and/or device, with which cooling system 100 is associated, is operating, being moved (e.g., as a result of shipping, handling, being dropped, etc.), subjected to vibration, etc.

Heat sink 120 may include one or more devices that absorb heat, from component 130 associated with a network device, for dissipation over a surface area and/or environment associated with heat sink 120. Heat sink 120 may be mounted to the component in order to absorb heat that is generated from and/or emitted by the component. Heat sink 120 may include a heat sink base 122 and/or a group of fins 124 that are attached to heat sink base 122. Heat sink base 122 and/or fins 124 may absorb and/or dissipate heat that is generated by component 130.

Heat sink base 122 and/or fins 124 may be made of a material, such as copper, aluminum, etc., that is capable of absorbing and/or conducting heat. For example, heat sink base 122 and/or fins 124 may be made of a thermally conductive material that has a coefficient of thermal conductivity that is less than a threshold. Fins 124 may include a group of plates that are secured to heat sink base 122. Fins 124 may be secured to heat sink base 122 in a manner that enables fins 124 to absorb heat from heat sink base 122 and/or to distribute the heat throughout a volume and/or surface area of each of fins 124. Fins 124 may be configured in a manner that maximizes a surface area via which the heat may be transferred into the environment, such as the atmosphere or a fluid (e.g., as in a radiator, etc.), while ensuring enough durability to withstand damage caused by tools, solvents, etc.

Component 130 may include one or more components, associated with a network device, that generate heat when operating. In one example, component 130 may be a chip that houses an integrated circuit, such as a microprocessor, an application specific integrated circuit (ASIC), a field-programmable gate array (FPGA), etc.

Base 140 may be a material of sufficient dimensions and/or rigidity to permit component 130 and/or retainer assembly 110 to be mounted. Base 140 may, in one example implementation, be a circuit board on which component 130 is mounted, receives power, transmits and/or receives signals, etc. Base 140 may, in another example implementation, act as a heat sink base that dissipates heat absorbed from component 130.

As shown in FIG. 1B, retainer assembly 110 may be installed on base 140 that causes heat sinks 120 to be aligned and/or in contact with components 130. For example, retainer assembly 110 may be positioned over components 130 in a manner that causes heat sinks 120 to be located and/or positioned between components 130 and retainer assembly 110. For example, retainer assembly 110 may be positioned over components 130 in a manner that causes fins 124, associated with heat sinks 120, to protrude through apertures and/or openings associated with retainer assembly 110. In another example, retainer assembly 110 may be positioned over components 130 in a manner that causes heat sinks 120 to be aligned and/or in contact with components 130. Retainer assembly 110 may be mounted (e.g., using fasteners, such as screws, rivets, clamps, etc.), to base 140, in a manner that allows retainer assembly 110 to impart a compressive force at interfaces between heat sink bases 120 and components 130.

Figure 2:
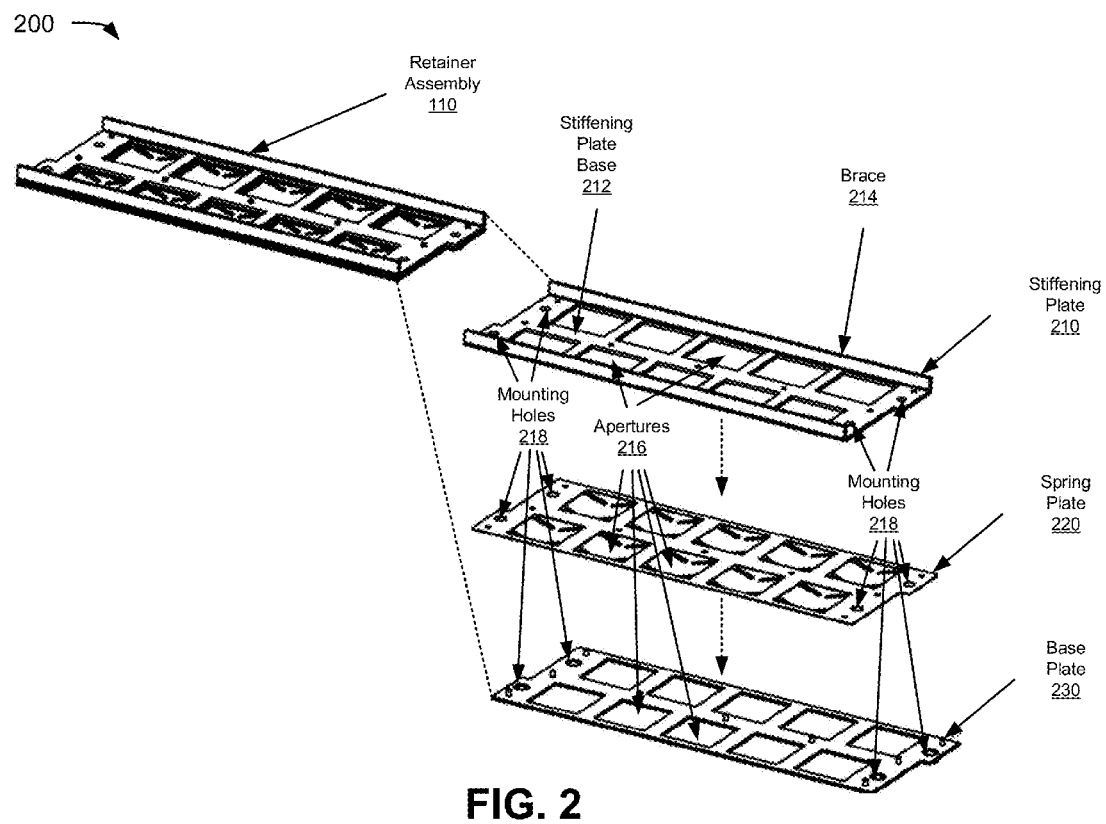
FIG. 2 is a diagram of example components of the retainer assembly of FIGS. 1A and 1B.

FIG. 2 is a diagram of example components 200 associated with retainer assembly 110. As shown in FIG. 2, components 200 may include a stiffening plate 210, a spring plate 220, and/or a base plate 230. The quantity of components, illustrated in FIG. 2, is provided for explanatory purposes only. In practice, there may be additional components, fewer components, different components, or differently arranged components than illustrated in FIG. 2. Also, in some implementations, one or more of the components of retainer assembly 110 may perform one or more functions described as being performed by another one or more of the components of retainer assembly 110. For example, stiffening plate 210, spring plate 220, and/or base plate 230 may be combined into a single component. In another example, retainer assembly 110 may include only stiffening plate 210 and/or spring plate 220. In yet another example retainer assembly 110 may include only stiffening plate 210.

Stiffening plate 210 may include stiffening plate base 212, brace 214, a group of apertures 216 (hereinafter collectively referred to as "apertures 216" and individually as "aperture 216"), and a group of mounting holes 218 (hereinafter collectively referred to as "mounting holes 218" and individually as "mounting hole 218").

Stiffening plate base 212 may be made of a material of sufficient dimensions and/or rigidity to allow retainer assembly 110 to be mounted to base 140, to allow compressive force to be imparted between heat sinks 120 and/or components 130, and/or to allow spring plate 220 and/or base plate 230 to maintain a shape when retainer assembly 110 is mounted to base 140. The material dimensions and/or rigidity may, for example, be selected to ensure that a quantity of deflection, associated with stiffening plate 210, spring plate 220, and/or base plate 230, is less than a threshold when the compressive force is applied. The material may, for example, be plastic, metal (e.g., such as copper, aluminum, stainless steel, nickel, etc.), ceramic, composite materials (e.g., graphite, Kevlar, fiberglass, ceramic matrices, etc.). Stiffening plate base 212 may be fabricated as a flat surface (e.g., that conforms to a single plane), a surface that includes more than one plane, a curved surface, etc. In one example, stiffening plate base 212 may include a first plane that corresponds to one or more components 130 associated with a thickness relative to base 140 and/or a second plane that corresponds to another one or more components 130 associated with a different thickness relative to base 140.

Brace 214 may be made of a material of sufficient dimensions and/or rigidity to increase and/or control the rigidity and/or stiffness of stiffening plate base 212. The material may be plastic, metal, ceramic, composite materials etc. One or more braces 214 may be installed on stiffening plate base 212. Brace 214 may be installed on stiffening plate base 212 at any location and/or in any direction that does not coincide with and/or impinge on an area associated with aperture 216.

Aperture 216 may be an opening within the material associated with stiffening plate base 212. The opening, of aperture 216, may conform to an area and/or shape that correspond to an area and/or shape that is associated with fins 124 of heat sink 120. The size and/or shape of aperture 216 may allow fins 124 to protrude via aperture 216 when retainer assembly 110 is mounted to base 140. Stiffening plate base 212 may include a different aperture 216 (e.g., associated with a variety of sizes and/or shapes) for each heat sink 120 and/or each set of fins 124. Aperture 216 may also be an opening within spring plate 220 and/or base plate 230.

Mounting hole 218 may include a hole via which a fastener may be inserted to mount retainer assembly 110 and/or stiffening plate 210 to base 140. Mounting hole 218, within stiffening plate base 212, may correspond to other mounting holes 218 within base 140, spring plate 220, and/or base plate 230.

Spring plate 220 may be made of a material of sufficient dimensions and/or rigidity to include one or more retaining springs, to be described in detail below with respect to FIG. 3, that are used to apply a force and/or pressure on heat sink 120 when retainer assembly 110 is mounted to base 140. The applied force and/or pressure may, for example, allow the compressive force to be imparted between heat sink 120 and/or component 130 when retainer assembly 110 is mounted to base 140. The material, associated with spring plate 220, may include plastic, metal, ceramic, composite materials, etc. Dimensions of spring plate base 220 may generally conform to dimensions associated with stiffening plate 210. For example, locations, quantities, sizes, and/or shapes of apertures 216 and/or mounting holes 218, included within stiffening plate 210, may correspond to locations, quantities, sizes, and/or shapes of apertures 216 and/or mounting holes 218 included within spring plate 220. Additionally, or alternatively, perimeter dimensions (e.g., length, width, etc.), associated with spring plate 220 may generally conform to perimeter dimensions of stiffening plate 210.

Base plate 230 may be made of a material of sufficient dimensions and/or rigidity to allow heat sinks 120 to be aligned with components 130 that are mounted to base 140. The material, associated with base plate 230, may include plastic, metal, ceramic, composite materials, etc. Base plate 230 may, in one example, be used to align heat sinks 120 with components 130 prior to installing stiffening plate 210 and/or spring plate 220. Dimensions of base plate 230 (e.g., associated with a perimeter of base plate 230, apertures 216, mounting holes 218, etc.) may generally conform to dimensions associated with stiffening plate 210 and/or spring plate 220 in a manner similar to that described above. A thickness and/or rigidity, associated with base plate 230, may generally be equal to or less than a thickness and/or rigidity associated with stiffening plate 210 and/or base plate 230.

Figure 3:
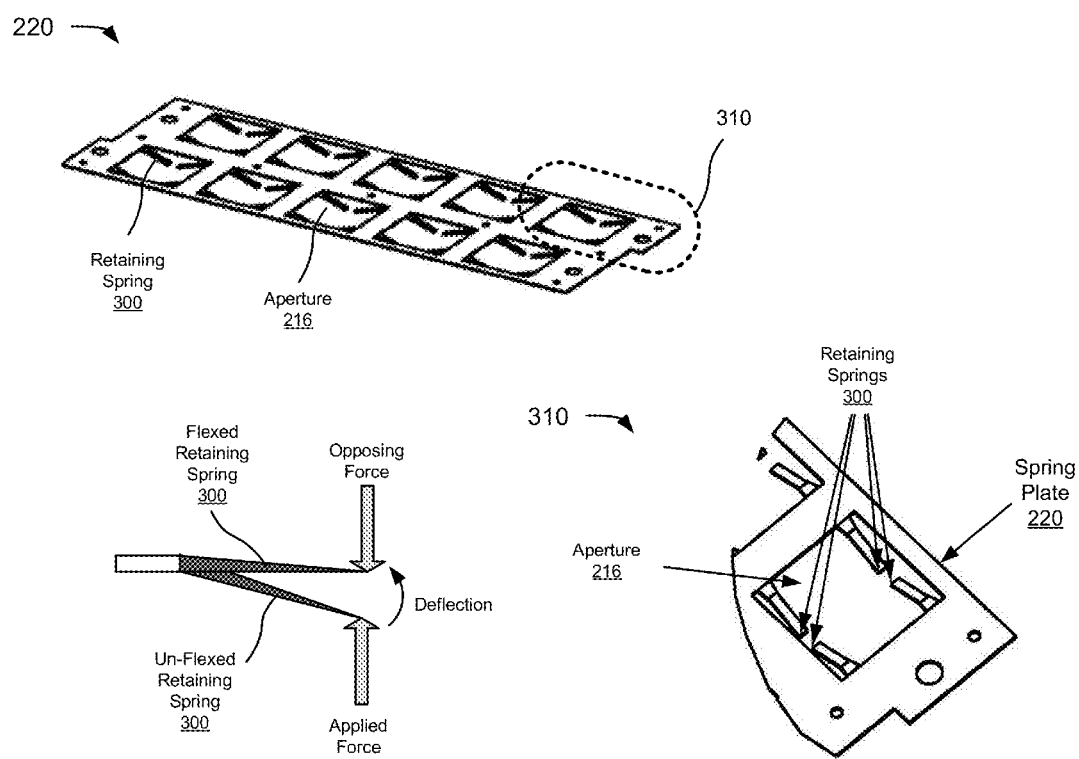
FIG. 3 is a diagram of example components associated with a spring plate of FIG. 2.

FIG. 3 is a diagram of example components associated with spring plate 220. As shown in FIG. 3, spring plate 220 may include one or more apertures 216 (FIG. 2) and/or a group of retaining springs 300 (hereinafter referred to collectively as "retaining springs 300" and individually as "retaining spring 300") associated with each aperture 216 (e.g., as shown by ellipse 310).

Retaining spring 300 may include a material that acts as a spring when attached to spring plate 220 and/or when spring plate 220 is installed on base 140. One or more retaining springs 300 may be associated with each aperture 216. The material, of retaining spring 300, may include, for example, spring stainless steel, spring steel alloys, copper allows, plastic and/or other flexible materials with spring-like properties.

Retaining spring 300 may include a shape and/or materials with spring-like properties. For example, retaining spring 300 may be capable of flexing under load when a force is applied (e.g., shown as an arrow labeled as "applied force"). Retaining spring 300 may flex (e.g., shown as flexed retaining spring 300) in proportion to the applied force (e.g., shown as a curved arrow labeled as "deflection" in FIG. 3). Retaining spring 300 may exert an opposing force (e.g., shown as down-pointing arrow labeled as "opposing force") that increases as a quantity of deflection increases. Retaining spring 300 may return to an original shape (e.g., shown as un-flexed retaining spring 300) when the applied force is removed.

Retaining spring 300 may apply a force (e.g., that corresponds to the opposing force) to heat sink 120 when retainer assembly 110 is installed on base 140. The force, applied to heat sink 120, may be controlled based on a quantity of retaining springs 300, associated with aperture 216 via which heat sink 120 protrudes, when retainer assembly 110 is installed. The force applied to heat sink 120 may, for example, be increased by increasing the quantity of retaining springs 300 associated with aperture 216.

The quantity of force applied to heat sink 120 may also be controlled based on a quantity of stiffness associated with retaining spring 300. The quantity of stiffness may correspond to a degree to which retaining spring 300 resists deflection as a function of the applied force. For example, the stiffness, and thus the force applied to heat sink 120, may be increased by using retaining spring 300 that is made of a stiffer material. Additionally, or alternatively, the force applied to heat sink 120 may be increased by increasing a thickness associated with the material with which retaining spring 300 is made.

Figure 4:
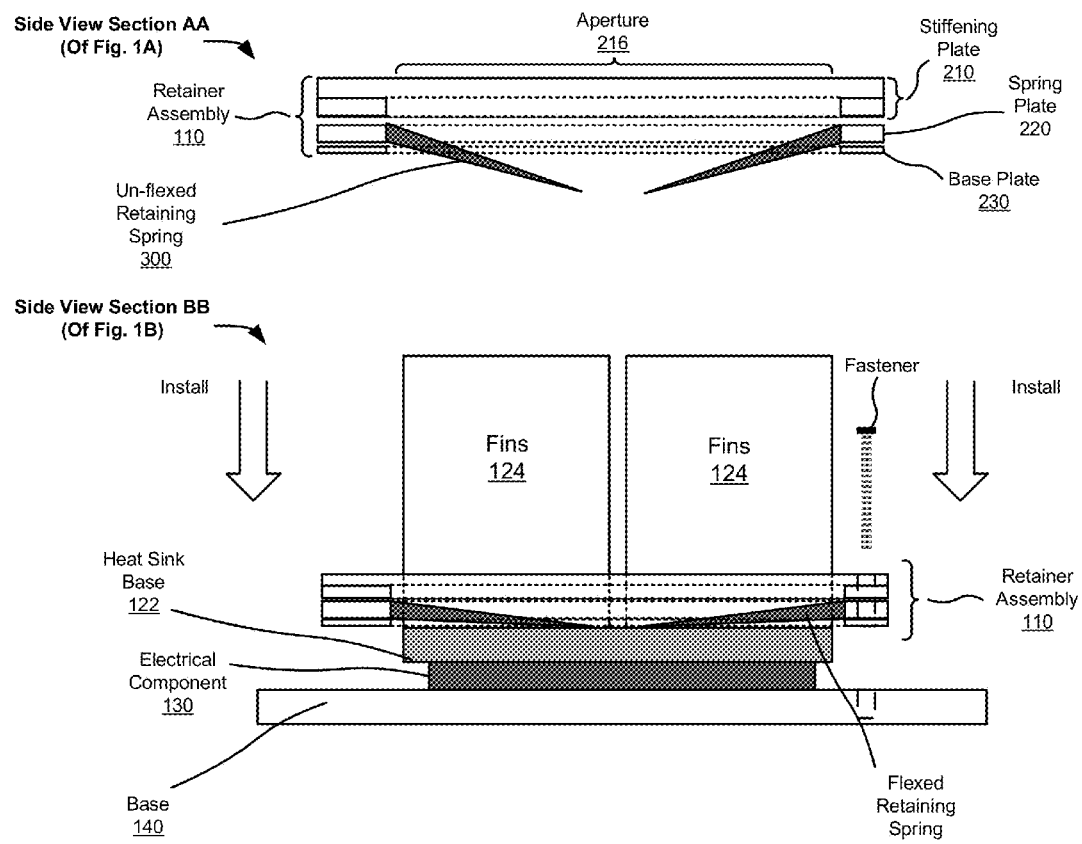
FIG. 4 is diagram of an example retainer assembly installed on a heat sink and/or base according to an implementation described herein.

FIG. 4 is diagram of retainer assembly 110 installed on heat sink 120 and/or base 140 according to an implementation described herein. As shown in FIG. 4, side view section AA (FIG. 1A), corresponds to a side view of a portion of retainer assembly 110 before being installed on base 140. For example, the portion of retainer assembly 110 includes a portion of stiffening plate 210, spring plate 220, base plate 230, and un-flexed retaining springs 300. The portion of stiffening plate 210, spring plate 220, and/or base plate 230 that are represented by dotted lines may correspond to aperture 216 via which heat sink 120 may protrude when retainer assembly 110 is installed on base 140.

As also shown in FIG. 4, side view section BB (FIG. 1B) corresponds to a side view of a portion of cooling system 100 with retainer assembly 110 installed on base 140. For example, the portion of cooling system 100 includes a portion of retainer assembly 110, heat sink 120 (e.g., represented by heat sink base 122 and/or fins 124), component 130, and base 140. Retainer assembly 110 includes flexed retaining springs 300 as a result of being installed on base station 140.

Retainer assembly 110 is installed by moving (e.g., in the downward direction of the arrows labeled as "installed") retainer assembly 110 in a manner that causes retainer assembly 110 (e.g., base plate 230) to come into contact with heat sink base 122. The installation of retainer assembly 110 may also cause fins 124 to protrude through aperture 216. Retainer assembly 110 may be positioned in a manner that aligns heat sink 120 with component 130. For example, positioning retainer assembly 110 may cause an area, associated heat sink base 122, to cover another area associated with component 130. One or more fasteners may be inserted through mounting holes 218 and into base 140 to fix retainer assembly 110 in the position.

Installing retainer assembly 110 may cause retaining springs 300 to deflect (e.g., shown as flexed retaining spring 300). The deflection of retaining springs 300 may impart a force, on heat sink 120 that causes heat sink base 122 to contact and/or remain stationary, relative to component 130, which may enable heat, that is generated by component 130, to be transferred to and/or dissipated by heat sink 120.

Figure 5:
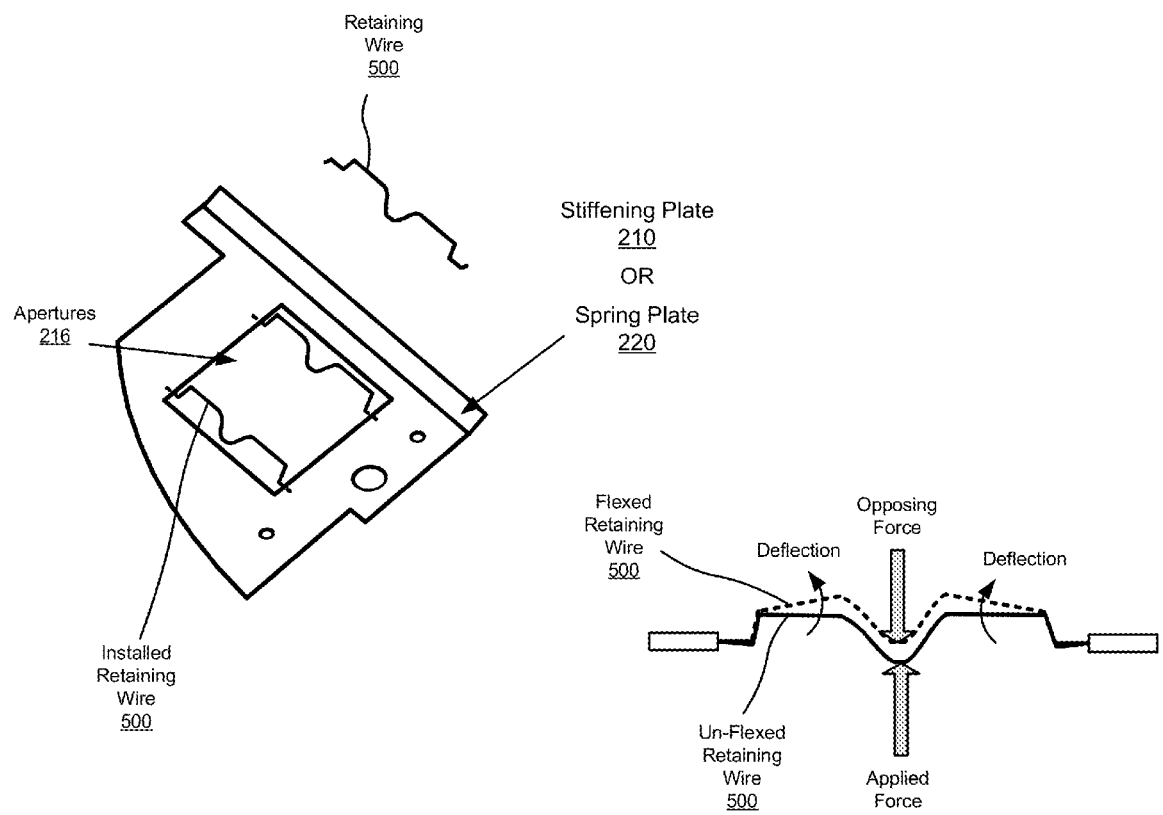
FIG. 5 is a diagram of an example retaining spring installed in a stiffening plate and/or spring plate of FIG. 2.

FIG. 5 is a diagram of an example retaining wire 500 according to an implementation described herein. As shown in FIG. 5, retaining wire 500 may be a material, such as a wire, associated with a particular shape that acts as a spring when attached, at each end of retaining wire 500, to stiffening plate 210 and/or spring plate 220. One or more retaining wires 500 may be associated with each aperture 216. The material may, for example, include spring stainless steel, spring steel alloys, copper allows, plastic and/or another flexible material with spring-like properties.

Retaining wire 500 may, in a manner similar to that described above with respect to FIG. 3, include a shape and/or material with spring-like properties. For example, retaining wire 500 may be capable of flexing under load when a force is applied (e.g., shown as an arrow labeled as "applied force"). Retaining wire 500 may flex and/or distort (e.g., shown as a dashed line that is identified as flexed retaining wire 500) in proportion to the applied force (e.g., shown as a curved arrows labeled as "deflection"). Retaining wire 500 may exert an opposing force (e.g., shown as a down-pointing arrow labeled as "opposing force") that increases as a quantity of deflection increases. Retaining wire 500 may return to an original shape (e.g., shown as a solid line that is identified as un-flexed retaining wire 500) when the applied force is removed.

Retaining wire 500 may apply a force (e.g., that corresponds to the opposing force) to heat sink 120 when retainer assembly 110 is installed on base 140. The force, applied to heat sink 120 may be controlled based on a quantity of retaining wires 500, associated with aperture 216, when retainer assembly 110 is installed. The force applied to heat sink 120 may, for example, be increased by increasing the quantity of retainer wires 500 associated with aperture 216.

The amount of force applied to heat sink 120 may also, or alternatively, be controlled based on an amount of stiffness associated with retaining wire 500. The amount of stiffness may correspond to a degree to which retaining wire 500 resists deflection as a function of the applied force. For example, the stiffness, and thus the force applied to heat sink 120, may be increased when retaining wire 500 is made of a stiffer material. Additionally, or alternatively, the force applied to heat sink 120 may be increased by increasing a diameter and/or thickness associated with the materials with which retaining wire 500 is made.

In another example implementation, retaining wire 500 may be installed, on an individual basis, between fins 124. For example, retaining wire 500 may be installed by sliding retaining wire 500 between fins 124. Sliding each retaining wire 500 between fins 124 may be performed without attaching retaining wire 500 to stiffening plate 210 and/or spring plate 220. Retaining wires 500, that have been individually installed, may apply a force to heat sink 120 when stiffening plate 210 is mounted to base 140. In this example, installing retaining wires 500 individually may enable heat sink 120 to be fixed in a stationary position, relative to component 130, using stiffening plate 210 and without using spring plate 220.

Figure 6A:
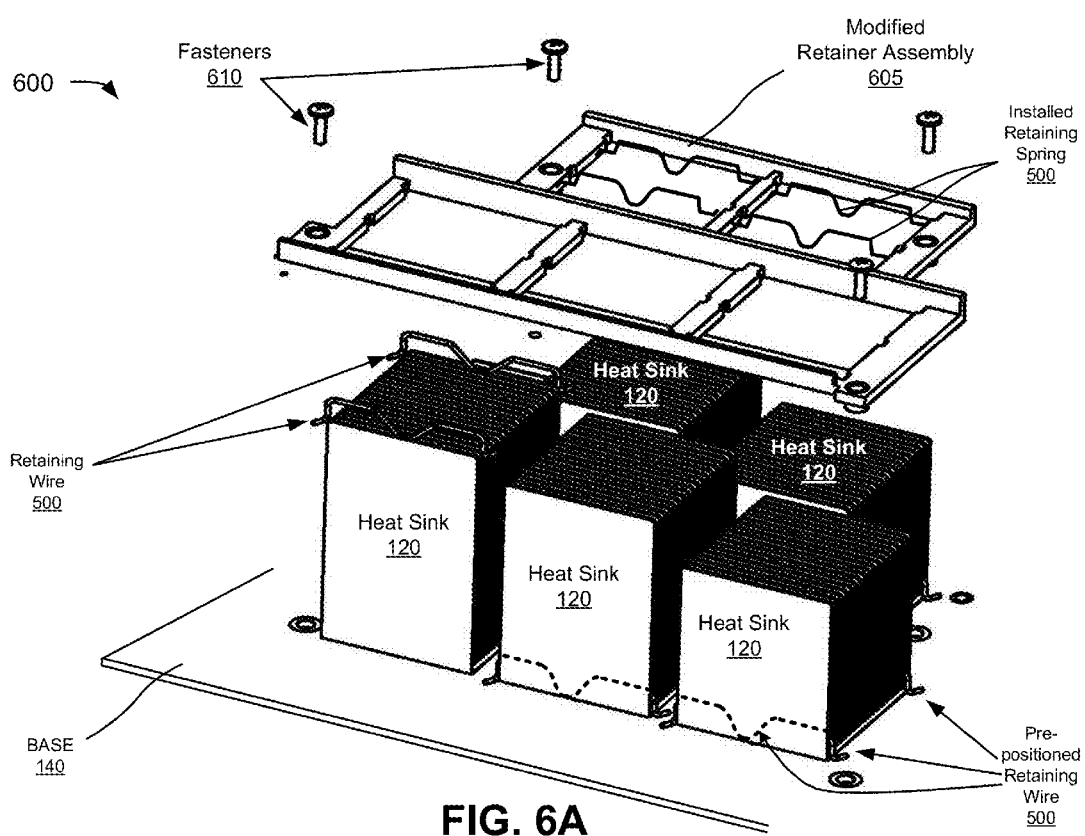
FIGS. 6A and 6B are diagrams of an installation of another cooling system using a modified retainer assembly, according to an implementation described herein.
Figure 6B:
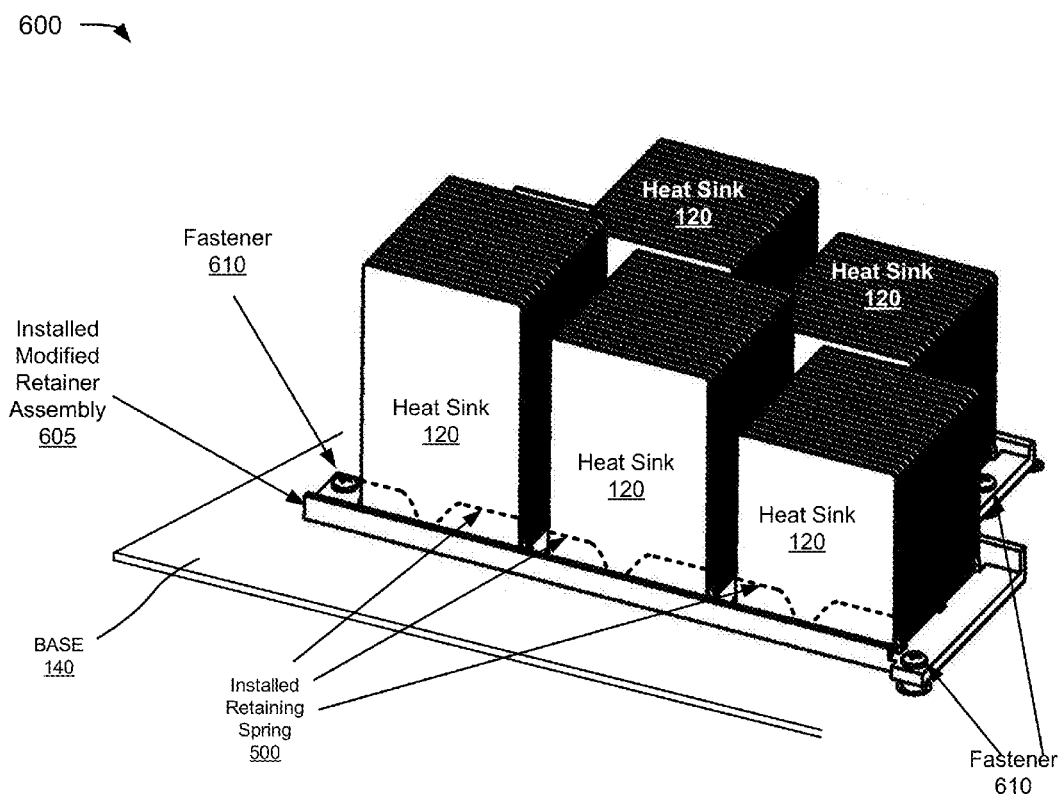

FIGS. 6A and 6B are diagrams of an installation of cooling system 600 using a modified retainer assembly, according to an implementation described herein. As shown in FIG. 6A, cooling system 600 may include a set of heat sinks 120, a base 140, a set of retaining wires 500, a retainer assembly 605, and fasteners 610. The quantity of devices, illustrated in FIG. 6A, is provided for explanatory purposes only. In practice, there may be additional devices, fewer devices, different devices, or differently arranged devices than illustrated in FIG. 6A.

Retainer assembly 605 may include one or more devices that enable cooling devices to be installed on components that are mounted to a circuit board. In an example implementation, retainer assembly 605 may include stiffening plate 210 that allows retainer wire 500 to be installed in stiffening plate 210. Retaining wire 500 may be installed in stiffening plate 210 by attaching each end of retaining wire 500, associated with aperture 216, to stiffening plate 210 (e.g., shown as installed retaining wire 500). In another example implementation retainer assembly 605 may include a stiffening plate 210 that does not include attached retaining wire 500. For example, retaining wire 500 may be slid between fins 124, on an individual basis, to pre-position retaining wire 500 on heat sink 120 (e.g., shown as a dashed line and identified as pre-positioned retaining wire 500). The ends of each pre-positioned retaining wire 500 may extend beyond fins 124 in a manner that allows retainer assembly 605 to make contact with each end of pre-positioned retaining wire 500 when installed on heat sink 120 and/or base 140.

Retainer assembly 605 may, in a manner similar to that described above with respect to FIG. 1A, allow heat sinks 120 to be aligned with components 130 when retainer assembly 605 is installed on base 140. Additionally, or alternatively, retainer assembly 605 may, in a manner similar to that described above with respect to FIG. 1A, allow heat sinks 120 to be mounted to components 130 when retainer assembly 605 is installed on base 140. Additionally, or alternatively, retainer assembly 605 may, in a manner similar to that described above with respect to FIG. 1A, cause heat sink 120 to contact component 130 with a quantity of force and/or pressure that is greater than a threshold. The quantity of force and/or pressure may be imparted and/or controlled by installed retaining wire 500 and/or pre-positioned retaining wire 500 when retainer assembly 605 is installed on heat sink 120 and/or base 140. The quantity of force and/or pressure may allow heat sink 120 to remain in contact with component 130 and/or to remain stationary, relative to component 130, when a network component and/or device, with which cooling system 600 is associated, is operating, is being moved (e.g., as a result of shipping, handling, being dropped, etc.), is being subjected to vibration, etc. Retainer assembly 605 may be fixed in place, relative to base 140, with fasteners 610 that are inserted into mounting holes 218 associated with retainer assembly 605 and/or base 140.

As shown in FIG. 6B, retainer assembly 605 may be installed on heat sinks 120 and/or base 140 that causes heat sinks 120 to be aligned and/or in contact with components 130. For example, retainer assembly 605 may, in a manner similar to that described with respect to FIG. 4, be installed on heat sinks 120 and/or base 140. An operator, associated with cooling system 600, may position retainer assembly 605, relative to base 140, in a manner that causes fins 124, associated with heat sinks 120, to protrude through apertures 216 associated with retainer assembly 605. In another example, retainer assembly 110 may be positioned in a manner that causes heat sinks 120 to be aligned and/or in contact with components 130. Aligning heat sinks 120 with components 130 may ensure that an area associated with heat sink base 122 completely covers an area associated with component 130.

Retainer assembly 605 may be positioned in a manner that causes the ends of pre-positioned retaining wires 500 to be in contact with retainer assembly 605. In another example, retainer assembly 605 may be positioned in a manner that allows retaining wires 500, that are attached to retainer assembly 605, to be positioned between fins 124 associated with base station 120. Retainer assembly 605 may be mounted to base 140 using fasteners 610, such as screws, rivets, clamps, etc. Mounting retainer assembly 605 to base 140 allows attached retainer wires 500 and/or pre-positioned retaining wires 500 to impart a compressive force and/or pressure on heat sink bases 122 that allows heat sinks 120 to be in contact with components 130 and/or to remain stationary relative to components 130 and/or base 140. The compressive force and/or pressure may be tailored to each heat sink 120 depending on respective heights of components 130, different types of components 130, thicknesses of heat sink bases 122, etc. Tailoring the compressive force and/or pressure may be performed by controlling a stiffness and/or deflection associated with retaining wires 500. For example, in a manner similar to that described above with respect to FIG. 5, the relative stiffness and/or deflection, associated with retaining wire 500, may be controlled by selecting retaining wire 500 based on types of materials that retaining wire 500 are made of and/or dimensions (e.g., thickness, diameter, etc.) associated with retaining wire 500.

A system and/or method, described herein, may enable one or more electrical components to be cooled using a cooling system that is installed using a retainer assembly. The system and/or method may allow the retainer assembly to be used to align cooling devices with the components. The system and/or method may allow the retainer assembly to be used to mount the cooling devices to the components by installing the retainer assembly to a circuit board on which the components are installed. The system and/or method may allow a force and/or pressure, used to mount the cooling devices to the components, to be tailored to each cooling device and/or component based on a stiffness and/or deflection associated with retaining springs and/or wires that are used by the retainer assembly. The system and/or method may allow the retainer assembly to mount the cooling devices, to the components, in a manner that decreases a mounting area, relative to the circuit board, that would be used when mounting the cooling devices without using the retainer assembly. The decreased mounting area may enable additional components to be installed on the circuit board and/or may permit a component density to be increased as a result of mounting the cooling devices using the retainer assembly.

The foregoing description provides illustration and description, but is not intended to be exhaustive or to limit the embodiments to the precise form disclosed. Modifications and variations are possible in light of the above teachings or may be acquired from practice of the embodiments.

Even though particular combinations of features are recited in the claims and/or disclosed in the specification, these combinations are not intended to limit the disclosure of the embodiments. In fact, many of these features may be combined in ways not specifically recited in the claims and/or disclosed in the specification.

No element, act, or instruction used in the present application should be construed as critical or essential unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A system comprising:

a retainer assembly to align each of a plurality of cooling devices with a corresponding one of a plurality of electrical components that are mounted to a circuit board, each of the plurality of cooling devices having a corresponding one of a plurality of bases and each of the plurality of cooling devices having a corresponding one of a plurality of groupings of fins that extends from a respective one of the plurality of bases, each of the plurality of bases having a first surface that contacts a respective one of the plurality of electrical components and a second surface, opposite the first surface, a respective one of the plurality of groupings of fins being provided on the second surface, such that the plurality of groupings of fins is spaced from and does not contact the electrical components, where the retainer assembly includes a first plate, a second plate, and a third plate, the first plate having a plurality of first apertures, the second plate having a plurality of first apertures, and the third plate having a plurality of first apertures, such that each of the plurality of groupings of fins extends from a respective one of the plurality of bases through a corresponding one of the plurality of first apertures of the first plate, a corresponding one of the plurality of first apertures of the second plate, and a corresponding one of the plurality of first apertures of the third plate when the retainer assembly is installed on the circuit board, and where the second plate is provided between the first and third plates and includes a plurality of retaining springs, each of which being associated with a corresponding one of the plurality of first apertures of the second plate, that apply a respective one of a plurality of forces to a corresponding one of the plurality of cooling devices when the retainer assembly is installed on the circuit board, each of the first, second, and third plates having a plurality of second apertures; and a set of fasteners, each of which extending through a corresponding one of the plurality of second apertures of the first, second, and third plates, to mount the retainer assembly to the circuit board, such that each of the plurality of cooling devices dissipates heat that is generated by a corresponding one of the plurality of electrical components.

2. The system of claim 1, where the plurality of retaining springs, that apply the respective one of the plurality of forces to the corresponding one of the plurality of cooling devices, cause each of the plurality of cooling devices to be in contact with the corresponding one of the plurality of electrical components.

3. The system of claim 1, where one of the forces fixes a first one of the plurality of cooling devices in a stationary position relative to a first one of the plurality of electrical components or the circuit board.

4. The system of claim 3, where a second one of the plurality of forces fixes a second one of the plurality of cooling devices in a stationary position relative to a second one of the plurality of electrical components or the circuit board, and where the second one of the plurality of forces is different than the first one of the plurality of forces based on different dimensions associated with the first one of the plurality of cooling devices relative to the second one of the plurality of cooling devices, or the first one of the plurality of electrical components relative to the second one of the plurality of electrical components.

5. The system of claim 4, where the first one of the plurality of forces is associated with a first set of retaining springs of the plurality of retaining springs, where the second one of the plurality of forces is associated with a second set of retaining springs of the plurality of retaining springs, and where the first set of retaining springs is associated with a different amount of stiffness than the second set of retaining springs.

6. The system of claim 1, where the first plate ensures that a quantity of deflection, associated with the spring plate, is less than a threshold when the retainer assembly is mounted to the circuit board, or allows each of the plurality of retaining springs to apply the one of the plurality of forces to the corresponding one of the plurality of cooling devices.

7. The system of claim 1, where the third plate aligns the each of the plurality of cooling devices with the corresponding one of the plurality of electrical components before installing the retainer assembly to the circuit board.

8. The system of claim 1, where the retainer assembly allows each of the plurality of retaining springs to deflect when the retainer assembly is installed on the circuit board, and where allowing each of the plurality of retaining springs to deflect causes the respective one of the plurality of forces to be applied to a corresponding one of the plurality of cooling devices.

9. A system in accordance with claim 1, wherein the plurality of retaining springs is a plurality of first retaining springs, the system further comprising a second retaining spring, a third retaining spring, and a fourth retaining spring, one of the plurality first retaining springs and the second retaining spring being provided along a first edge of the second plate, and the third and fourth retaining springs being provided along a second edge of the second plate, the first and second edges of the second plate extending parallel to one another, the second plate having a third and fourth edges that extend parallel to one another and perpendicular to the first and second edges, the first, second, third, and fourth edges defining one of the plurality of first apertures of the second plate.

* * * * *